(12) United States Patent
Chang et al.

(10) Patent No.: US 6,968,525 B2
(45) Date of Patent: Nov. 22, 2005

(54) IMPLEMENTING METHOD FOR BUFFERING DEVICES

(75) Inventors: Yung-Chung Chang, Shindian (TW); You-Ming Chiu, Taipei (TW)

(73) Assignee: VIA Technologies, Inc., Taipei (TW)

(*) Notice: Subject to any disclaimer, the term of this patent is extended or adjusted under 35 U.S.C. 154(b) by 0 days.

(21) Appl. No.: 10/883,824

(22) Filed: Jul. 6, 2004

(65) Prior Publication Data

US 2004/0243965 A1 Dec. 2, 2004

Related U.S. Application Data

(62) Division of application No. 10/175,041, filed on Jun. 20, 2002, now Pat. No. 6,826,637.

(30) Foreign Application Priority Data

Jul. 27, 2001 (TW) .............................. 90118507 A

(51) Int. Cl.[7] .............................................. G06F 9/45
(52) U.S. Cl. ................. 716/10; 716/8; 716/9; 716/11
(58) Field of Search .......... 716/4–6, 8–12; 703/14–16; 257/666, 786

(56) References Cited

U.S. PATENT DOCUMENTS

| | | | |
|---|---|---|---|
| 4,811,237 A * | 3/1989 | Putatunda et al. ............. | 716/9 |
| 4,947,233 A * | 8/1990 | Aso ........................... | 257/203 |
| 5,498,767 A * | 3/1996 | Huddleston et al. .......... | 716/12 |
| 5,648,680 A * | 7/1997 | Ogawa et al. .............. | 257/666 |
| 5,801,451 A * | 9/1998 | Yamauchi .................... | 257/786 |
| 6,480,817 B1 * | 11/2002 | Peters et al. ................. | 703/15 |
| 6,694,463 B2 * | 2/2004 | Hui et al. .................... | 714/724 |
| 6,704,910 B2 * | 3/2004 | Hong ........................... | 716/1 |

* cited by examiner

Primary Examiner—Matthew Smith
Assistant Examiner—Naum Levin
(74) Attorney, Agent, or Firm—Rabin & Berdo, P.C.

(57) ABSTRACT

An implementing method for buffering devices is provided, so as to dispose the buffering devices on a chip. The chip includes a signal source root and the number X of output bonding pads, in which the number X is a positive integer. The implementing method of the present invention includes (a) implementing a buffering device for the $N^{th}$ layer at a location close to the middle place between two output bonding pads, and electrically connecting each one of the output bonding pads to the corresponding one of the buffering devices for the $N^{th}$ layer, respectively. (b) A buffering device for the $N+1^{th}$ layer is implemented at a location close to the middle place between two buffering devices for the $N^{th}$ layer, and each one of the buffering devices for the $N^{th}$ layer is electrically connected to the corresponding one of the buffering devices for the $N+1^{th}$ layer, respectively. Then, the number of the buffering devices for the $N+1^{th}$ layer is judged whether or not to be 1. If it is, then the buffering device for the $N+1^{th}$ layer is connected to the signal source root and the method goes to end. If it is not, the method goes to the step (c). In the step (c), the quantity of the parameter N is added by 1, and then the method repeatedly performs the step (b).

8 Claims, 6 Drawing Sheets

IMPLEMENTING METHOD FOR BUFFERING DEVICES

CROSS-REFERENCE TO RELATED APPLICATION

This is a Divisional of U.S. application Ser. No. 10/175,041, filed Jun. 20, 2002, now U.S. Pat. No. 6,826,637.

This application claims the priority benefit of Taiwan application serial no. 090118507, filed Jul. 27, 2001.

BACKGROUND OF THE INVENTION

1. Field of the Invention

This invention is relating to an implementing method for buffering devices, and is more particularly relating to an implementing method for forming buffering devices in one dimension by a tree structure with a dichotomy manner.

2. Description of Related Art

For the integrated circuit (IC) industry, it has been the one with the fastest speed in development and a large growth in the recent years. In the technology, the function of the semiconductor device is also greatly developed and changed day by day. In this situation, it is strongly needed to improve the integration and the multiple functions for the electronic devices. The integrated circuit is the device absolutely needed in the various new products, which are continuously presented in the market. Therefore, the integrated circuit industry can be considered as the most promising star as a high tech industry in the future.

In the current status, during the designing stage on the integrated circuit, it will use some electronic design automation (EDA) tools, so as to help the designing engineers to perform the steps of device placement and the circuit routing. When the EDA tools is used to optimize the design of the circuit layout on the chip, the conditions needed to be considered including the connection relation between the device cells and the path delay. However, the path delay considered by the usual design tool includes only the effect of gate delay, but not includes the effect of interconnect delay. But, since the path delay of the signals in the deep sub-micron chip is resulting from the interconnect delay for the most of cases, and then the EDA tools cannot optimize the circuit design for the deep sub-micron chip.

Referring to FIG. 1, it is a drawing, schematically illustrating a circuit layout as a combining result from using an EDA tool. As shown in FIG. 1, a chip 100 is formed with a number of output bond pads 110, 120, 130, 140, 150, 160, 170, and 180, a signal source root R, and a number of buffers B1, B2, B3, B4, B5, and B6. It has the equal distance between the adjacent output bonding pads. Since the signal generated at the signal source root R is necessary to be transmitted to the output bonding pads 110, 120, 130, 140, 150, 160, 170, and 180 at the same time, it needs the buffers B1, B2, B3, B4, B5, and B6 to amplify the output signal exported from the source root R. As a result, the amplified output signal can drive a number of output bonding pads. If the output signal exported from the signal source root R to the output bonding pads 110, 120, 130, 140, 150, 160, 170, and 180 is a clock signal, and the clock signal is a signal with a feature of synchronous need. The feature of synchronous need means that it is necessary to have the same arriving time for the clock signal exported from the signal source root R and arriving to the output bonding pads 110, 120, 130, 140, 150, 160, 170, and 180 through the buffers B1, B2, B3, B4, B5, and B6.

The output bonding pad 110 and the output bonding pad 180 are taken as an example. When the clock signal exported from the signal source root R to the output bonding pad 110, the clock signal goes through the connection path from the path P1, the path P2, and the path P3. Also and, the clock signal has an interconnection time delay by T1 for being exported to the output bonding pad 110. However, when the clock signal exported from the signal source root R to the output bonding pad 180, the clock signal goes through the connection path from the path P4, the path P5, and the path P6. Also and, the clock signal has an interconnection time delay by T2 for being exported to the output bonding pad 180. Since the inside of the chip already has areas that are placed with blocks of other circuits, the placement of the buffers is usually restricted. As a result, the lengths of total path for the clock signals exported from the signal source root R and respectively reaching to the output bonding pad 110 and the output bonding pad 180 are not the same. In other words, the total path length going through the path P1, the path P2, and the path P3 is not equal to the total path length through the path P4, the path P5, and the path P6. In this situation, the interconnection time delay for the clock signals going through the two path are therefore not equal, T1≠T2. Also therefore, the clock signals exported from the signal source root R cannot arrive to the output bonding pad 110 and the output bonding pad 180 at the same time. With the same reasons, the interconnection time delays for the clock signals exported from the signal source root R to the other output bonding pads are also different in connection time. Therefore, according to the example shown in FIG. 1, it cannot achieve the feature of synchronous need for the clock signal by only using the EDA tool to assemble the circuit chips.

In order to solve the foregoing issues, the current method is that after the EDA toot is used to assemble the circuit, a test procedure is then performed afterward to check whether or not the signal satisfies the feature of synchronous need. If it is not, an adjustment is performed. After that, jobs of the test procedure and adjustment are repeatedly performed until the signal satisfies the requirement of the synchronous need. As shown in FIG. 1, in a general situation, the engineer usually needs to adjust the locations of a number of the buffers, so as to satisfy the features of the synchronous need for the clock signals. Since the locations of the buffers on the chip are arranged in two dimensions, their location can be arranged along with the X-axis or the Y-axis. It is then very high complex and time consuming for the job in considering the various options for positioning the buffers and computing the total length of the connection path from each one of the buffers to the signal source root and the output bonding pads. Further still, the adjustment manner is performed by engineer's operation. Therefore, it would take a long time to repeatedly perform the test procedure and the adjustment. However, the lifetime of the products in the industry of the integrated circuit design is short. Since the product variation in the market is fast and the competition is also strong, the current method in developing the new product is therefore taking long time. This situation would not only increase the cost of research and development but also decrease the timely effectiveness and the competition.

SUMMARY OF THE INVENTION

It is therefore an objective of the present invention to provide an implementing method for a number of buffering devices, so that signals can arrive at the output bonding pads with a feature of synchronous need. It can further prevent the unnecessary job of adjustment and test in the circuit design from being repeatedly performed, so as to reduce the need of time to design the integrated circuit and the cost of researching and developing.

In accordance with the foregoing and other objectives of the present invention, an implementing method for a number of buffering device is provided, so as to dispose the buffering devices on a chip. The chip includes a signal source root and the number X of output bonding pads, in which the number X is a positive integer. The implementing method of the present invention includes (a) implementing a buffering device for the $N^{th}$ layer at a location close to the middle place between two output bonding pads, and electrically connecting each one of the output bonding pads to the corresponding buffering device for the $N^{th}$ layer, respectively. (b) One buffering device for the $N+1^{th}$ layer is implemented at a location close to the middle place between two buffering devices for the $N^{th}$ layer, and each one of the buffering devices for the $N^{th}$ layer is electrically connected to the corresponding one of the buffering devices for the $N+^{th}$ layer, respectively. Then, the number of the buffering devices for the $N+1^{th}$ layer is judged whether or not to be 1. If it is, then the buffering device for the $N+1^{th}$ layer is connected to the signal source root and the method goes to end. If it is not, the method goes to the step (c). In the step (c), the quantity of the parameter N is added by 1, and then the method repeatedly performs the step (b).

In accordance with another objective of the present invention, an implementing method for buffering devices is provided, so as to implement a number buffering devices on a chip. The chip includes a signal source root and a number X of output bonding pad, in which the quantity of X is a positive integer. The implementing method of the present invention includes (a) implementing a number Y of dummy loads and respectively making a node for each one of the output bonding pads and each one of the dummy loads. (b) One buffering device for the $N^{th}$ layer is implemented at the place close to the middle location between two nodes, and each one of the nodes is electrically connected to the corresponding one of buffering device for the $N^{th}$ layer, respectively. (c) One buffering device for the $N+1^{th}$ layer is implemented at the place close to the middle place between two buffering devices for the $N^{th}$ layer, and each one of the buffering devices for the $N^{th}$ layer is electrically connected to the corresponding one of the buffering device for the $N+1^{th}$ layer, respectively. Then, the number of the buffering devices for the $N+1^{th}$ layer is judged whether or not to be 1. If it is, then the buffering device for the $N+1^{th}$ layer is connected to the signal source root and the method goes to end. If it is not, the method goes to the step (d). In the step (d), the quantity of the parameter N is added by 1, and then the method repeatedly performs the step (c).

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 2A:
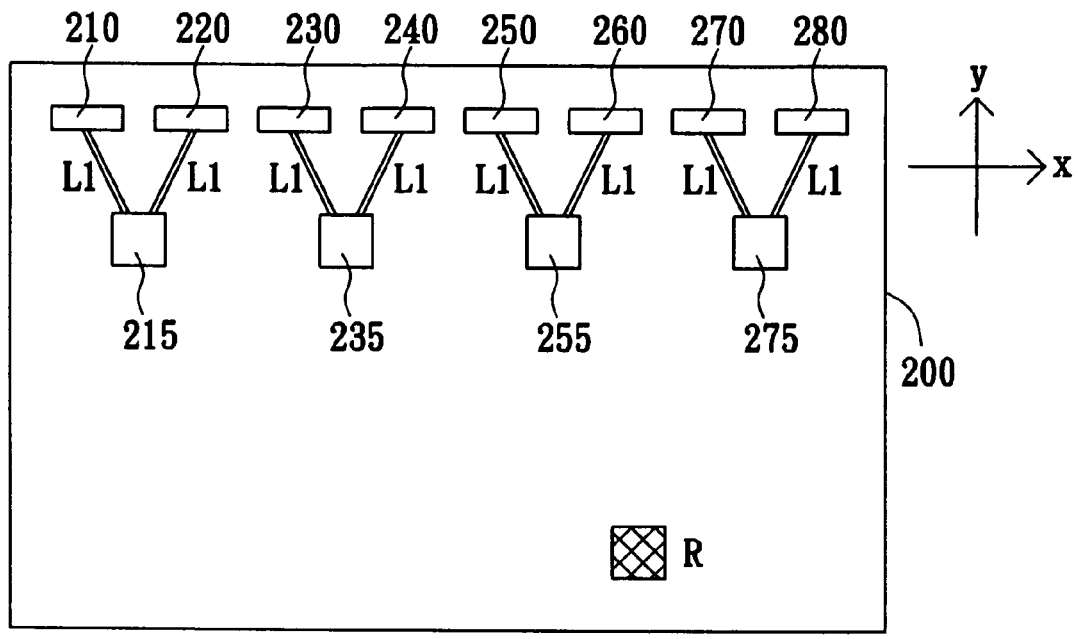
FIGS. 2A through 2C are drawings, schematically illustrating a procedure flow diagram to implement the buffering devices according to the present invention.
Figure 2B:
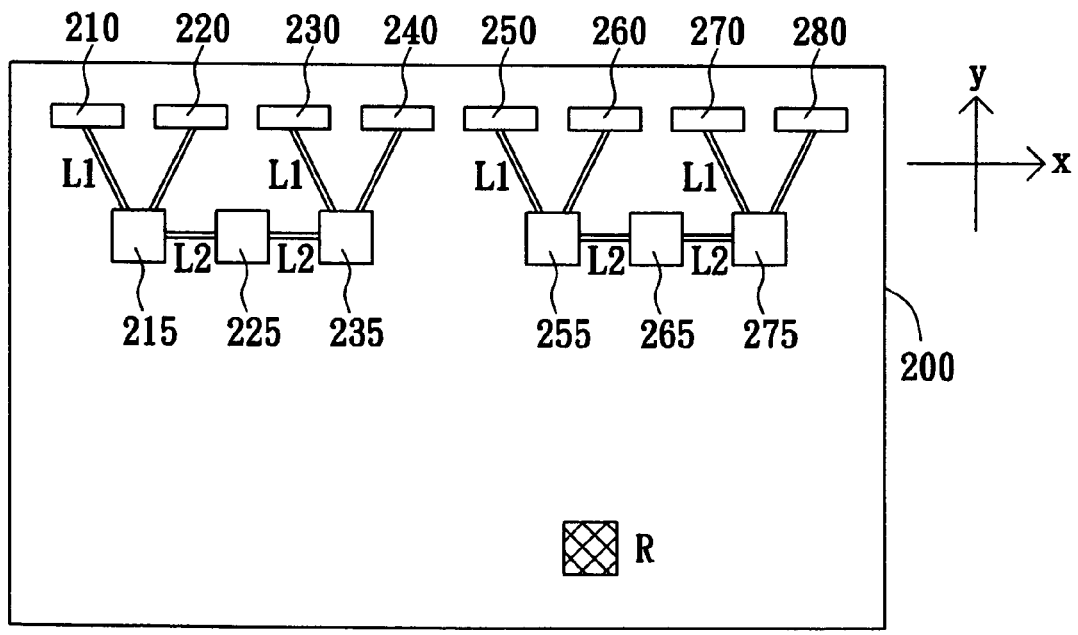
Figure 2C:
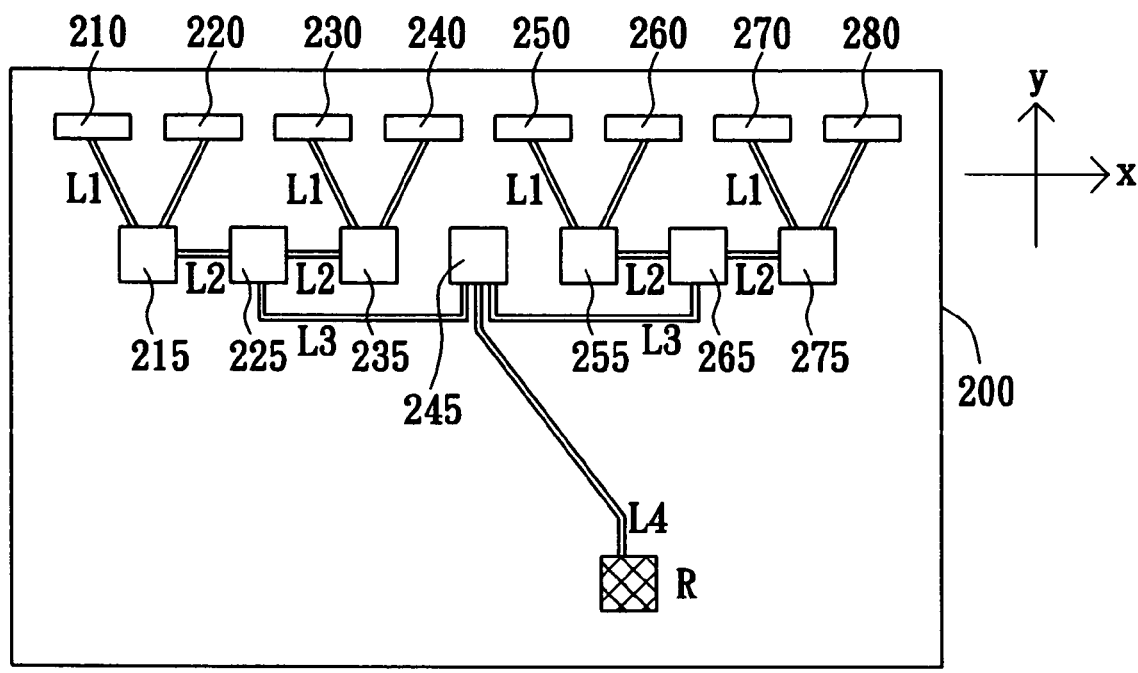

FIGS. 2A through 2C are drawings, schematically illustrating a procedure flow diagram to implement the buffering devices according to the present invention. As shown in FIG. 2A, the chip 200 has the output bonding pads 210, 220, 230, 240, 250, 260, 270, and 280, and a signal source root R. It has the same distance between the two output bonding pads. First, the output bonding pads are divided into a number of groups by every two. One buffering device for the first layer is disposed at about the middle place of the output bonding pads in the same group, so that the path lengths from one buffering device for the first layer to the corresponding two output bonding pads are the same. Wherein, the middle place of the output bonding pads in the same group means that a place below the middle point of the output bonding pads in the same group, and the middle place has the same x coordinate value with the middle point of the output two bonding pads. In addition, the present invention arranges that all of the buffering devices for the first layer have the same y coordinate value, so that each one of the buffering devices for the first layer can only be adjusted on the single direction along the direction of x axis.

For example, the middle place of the output bonding pad 210 and the output bonding pad 220 is disposed with a buffering device for the first layer 215, in which the length of the path from the buffering device for the first layer 215 to the output bonding pad 210 is equal to the length of the path from the buffering device for the first layer 215 to the output bonding pad 220. Also and, all of the lengths are equal to L1. Likewise, the lengths of the path from the buffering device for the first layer 255 to the output bonding pad 250 and to the output bonding pad 260 are also equal to L1. The lengths of the path from the buffering device for the first layer 275 to the output bonding pad 270 and to the output bonding pad 280 are also equal to L1.

Referring to FIG. 2B, the buffering device for the first layer 215 and the buffering device for the first layer 235 are grouped into one group, and the buffering device for the first layer 255 and the buffering device for the first layer 275 are grouped into another group. One buffering device for the second layer 225 is disposed at the middle place between the buffering device for the first layer 215 and the buffering device for the first layer 235, so that the length of the path from the buffering device for the second layer 225 to the buffering device for the first layer 215 is equal to the length of the path from the buffering device for the second layer 225 to the buffering device for the first layer 235. Both of the lengths are equal to L2. Likewise, the buffering device 265 is disposed at the middle place between the buffering device 255 and the buffering device 275, so that the lengths of the paths from the buffering device 265 to the buffering device 255 and to the buffering device 275 are all equal to L2.

Referring to FIG. 2C, a buffering device for the third layer 245 is disposed at the middle place between the buffering device for the second layer 225 and the buffering device for the second layer 265. The length of the path from the buffering device for the third layer 245 to the buffering device for the second layer 225 is equal to the L3. Also and, the length of the path from the buffering device for the third layer 245 to the buffering device for the second layer 265 is also equal to the L3. The length of the path from the signal source root R to the buffering device 245 is equal to L4.

Figure 1:
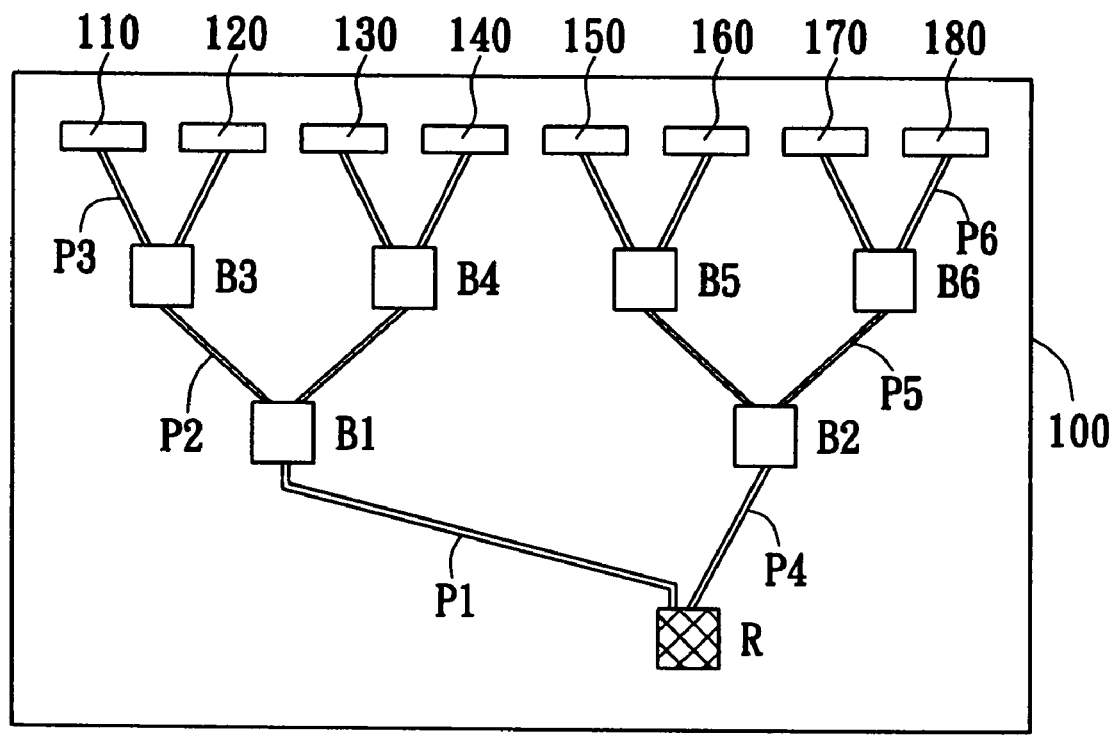
FIG. 1 is a drawing, schematically illustrating a circuit layout as a combining result from using an EDA tool.

For example, a clock signal exported from the signal source root R goes through the buffering device 245, the buffering device 225, and the buffering device 235, and then is exported to the output bonding pad 230. The total length of this path is the summation of L1, L2, L3, and L4. Also and, a clock signal exported from the signal source root R goes through the buffering device 245, the buffering device 265, and the buffering device 275, and then is exported to the output bonding pad 280. The total length of this path is also the summation of L1, L2, L3, and L4. With the same reasons, the total lengths of the paths from the signal source root R respectively to the output bonding pads 210, 220, 230, 240, 250, 260, 270, and 280 have the equal quantity. This is because all of the buffering devices and the paths form an one dimensional design with a tree structure by a dichotomy manner. Since each one of the lengths of the two interconnection paths from the buffering devices are equal, therefore, the clock signal exported from the signal source root R to the different output bonding pads all have the equal length. And therefore, the interconnection time delay for reach one of the paths is also equal. By comparing the implementation of the buffering device in FIG. 1 with FIG. 2C, the arrangement of the buffering devices in the FIG. 2C is an one dimensional disposal. As one can see, the method of the present invention modifies the two dimensional disposal, which originally is complicate, into the one dimensional disposal. Since the shifting vector of the buffering devices is restricted to one dimension, it can greatly reduce the complexity for deposing the buffering devices and the tedious computation.

Figure 3:
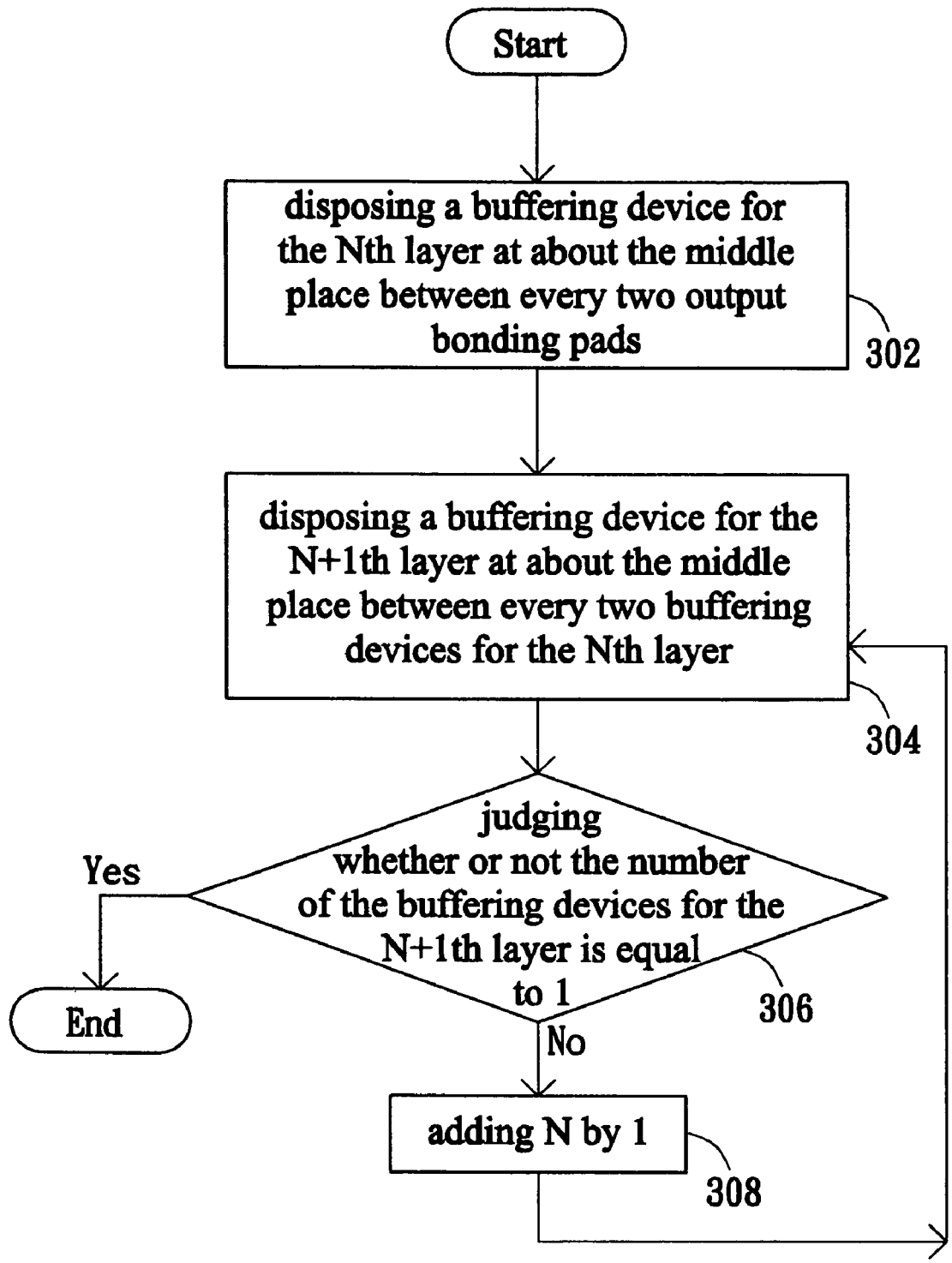
FIG. 3 is a drawing, schematically illustrating a procedure flow diagram to implement the buffering devices according to one preferred embodiment of the present invention.

In order to describe the features of the present invention in more details, referring to FIG. 3, it is a drawing, schematically illustrating a procedure flow diagram to implement the buffering devices according to one preferred embodiment of the present invention. In the step 302, a buffering device for the Nth layer is implemented at middle place between two output bonding pads. Also and, each one of the output bonding pads is electrically connected to the corresponding buffer device for the $N^{th}$ layer, respectively. Preferably, the buffering device for the Nth layer is implemented at the middle place between two output bonding pads. If the number of the output bonding pads is X with the need to receive the signal exported from the signal source root R at the same time, then the output bonding pads are grouped into groups, with each one of the groups having two. An buffering device for the $N^{th}$ layer is disposed at the middle location between the output bonding pads in the same group, so that the lengths of the paths from the buffering device for the $N^{th}$ layer to the two corresponding output bonding pads are the same, in which the number of the buffering devices for the $N^{th}$ layer is X/2. In the step 304, every two buffering devices for the $N^{th}$ layer are grouped into one group. A buffering device for N+1$^{th}$ layer is implemented at about the middle place between two buffering devices for the $N^{th}$ layer in the same group. Also and, each buffering device for the $N^{th}$ layer is electrically connected to the corresponding buffering device for the N+1$^{th}$ layer, respectively. Preferably, the buffering device for the N+1$^{th}$ layer is implemented at the middle place between two buffering devices for $N^{th}$ layer. In the step 306, the number of buffering devices for the N+1$^{th}$ layer is judged whether or not to be 1. If it is not, then the method goes to the step 308. If it is, then the method goes to end. In the step 308, the quantity of the parameter N is added by 1. After performing the step 308, the step 304 is repeatedly performed.

Referring to both FIG. 2 and FIG. 3, an example is described by taking the parameter N to be 1 as the initial value. As shown in the step 302, a buffering device for the first layer is disposed between every two output bonding pads, in which the buffering device for the first layer is for example 215, 235, 255, and 275. In the following step 304, a buffering device for the second layer is disposed between every two buffering devices for the first layer at the middle place, in which the buffering device for the second layer is for example 225 and 265. Since the number of the buffering devices for the second layer is not equal to 1, the step 308 is therefore performed, in which the quantity of N is added by 1. After then, the step 304 is repeatedly performed. After that, a buffering device for the third layer 245 is disposed between every two buffering devices for the second layer 225 and 265 at the middle place. Since the number of the buffering device for the third layer now is equal to 1, then the procedure goes to end.

Thus, referring to FIG. 2C and after performing the flow diagram as shown in FIG. 3, the chip 200 can be formed including a number X of output bonding pads, (in which the quantity of X is set to be equal to $2^M$, where M is equal to 3, is taken in FIG. 2C as an example for descriptions) a number of buffering devices and a signal source root R. The number X of output bonding pads includes the output bonding pads 210, 220, 230, 240, 250, 260, 270, and 280. The multiple buffering devices include buffering devices for the first layer, buffering devices for the second layer, . . . , and a buffering device for the $M^{th}$ layer. One buffering device for the first layer is disposed between every two output bonding pads at about the middle place. Each one of the output bonding pads is electrically connected to the corresponding buffering device for the first layer. For example, the buffering device for the first layer 215 is disposed between the output bonding pads 210 and 212 at the middle place, and is electrically connected to the output bonding pads 210 and 212. In addition, a parameter j is set to be 1<j<M+1, in which the quantity of j is a positive integer. One buffering device for the jth layer is disposed between every two buffering devices for the j−1 layer at about the middle place. Each one of the two buffering devices for the j−1 layer is electrically connected to the corresponding one of the buffering device for the j layer. For example, the buffering device for the second layer 225 is disposed between the two buffering devices for the first layer 215 and 235 at about the middle place, and is electrically connected to the two buffering devices for the first layer 215 and 235. A signal (not shown in drawing) exported from the signal source root R is transmitted to the number X of output bonding pads through these buffering devices. For example, the signal exported from the signal source root R can be transmitted to the output bonding pad 210 through the buffering device for the third layer 245, the buffering device for the second layer 225, and the buffering device for the first layer 215. Wherein, each one of the output bonding pads is electrically connected to all of the corresponding one of the buffering device for the first layer through the connection path, and each one of the j−1 layers of buffering device also goes through the connection path to electrically connect to the j layer of buffering device. All of the buffering devices are located in the same one straight line.

Figure 4:
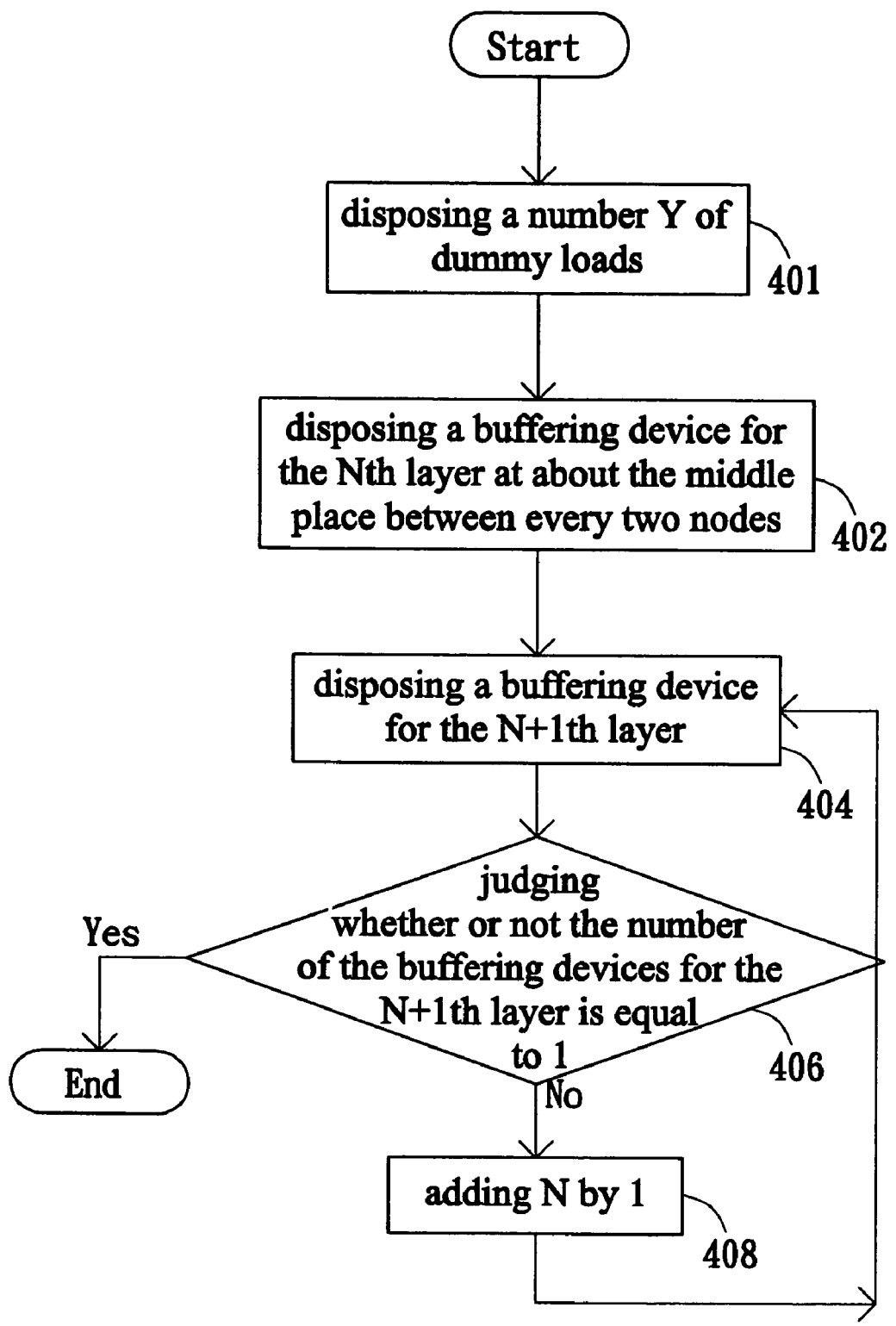
FIG. 4 is a drawing, schematically illustrating a procedure flow diagram to implement the buffering devices when the number of the output bonding pads is not equal to the number of 2 to a positive integer power index, according to one preferred embodiment of the present invention.

The steps as described above can only be performed for the case having the number X of output bonding pads, where the quantity of X is equal to a number by 2 to a positive integer power index. When the quantity of X is not equal to a number by 2 to a positive integer power index, the procedure flow diagram of the implementing method of the buffering devices is shown in FIG. 4. The difference of the procedure flow diagrams between FIG. 4 and FIG. 3 is only the step 401 and the step 402. Since the number X of the output bonding pads is not equal to the number by 2 to a positive integer power index, but the method of the present invention in a tree structure by the dichotomy manner for implementing the buffering devices can only be used for the condition with the quantity of X by 2 to a positive integer power index, then it needs the additional step 401. A number Y of dummy load are necessary to be additionally implemented, so that the summation of X and Y is equal to a number by 2 to a positive integer power index and each one of the dummy loads emulates a loading for one output bonding pad. In other words, the equivalent resistance value for each one of the dummy loads is equal to that of the output bonding pad. In the step 401, each one of the output bonding pads and each one of the dummy loads is further treated as a node. Moreover, in the step 402, a buffering device for the $N^{th}$ layer is implemented between every two nods at about the middle place. Also and, each one of the nodes is electrically connected to the corresponding buffering device for the $N^{th}$ layer. For the following steps of 404, 406, and 408 are the same as the steps of 304, 306, and 308 in FIG. 3. In the step of 404, a buffering device for $N+1^{th}$ layer is implemented between every two buffering devices for $N^{th}$ layer at about the middle place. Also and, each buffering devices for the two $N^{th}$ layer is electrically connected to the corresponding buffering device for the $N+1^{th}$ layer. In the step 406, it is judged whether or not the number of the buffering devices for the $N+1^{th}$ layer is equal to 1. If it is not, then the procedure goes to the step 408. If it is, then the procedure goes to end. In the step 408, the quantity of N is added by 1.

Figure 5:
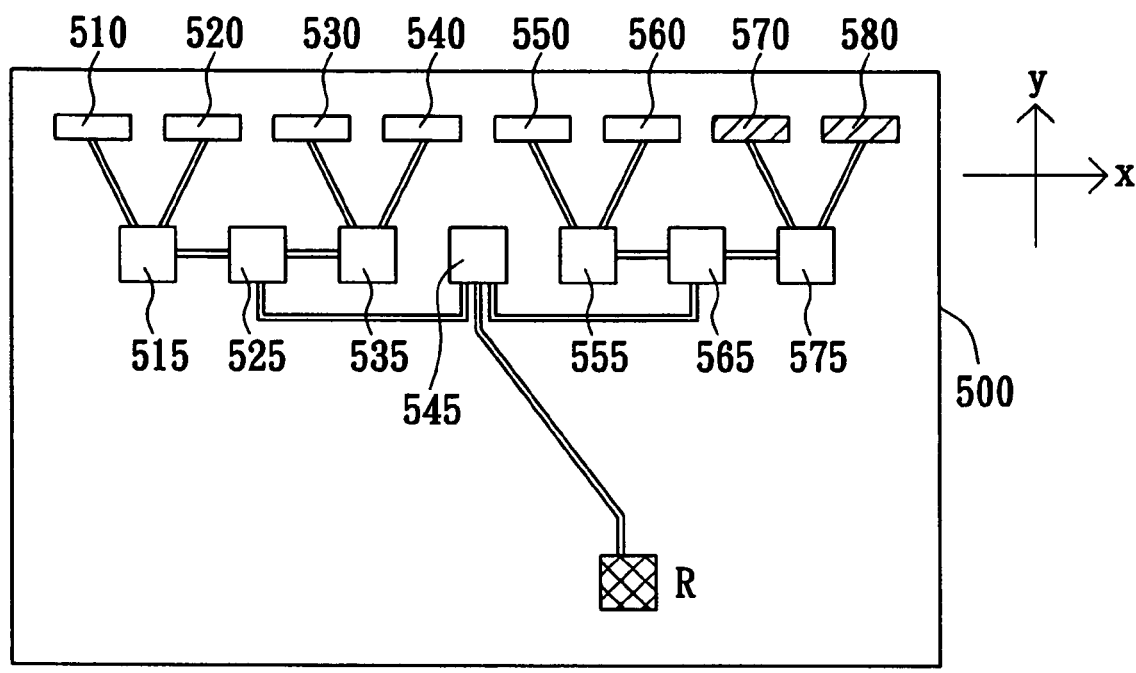
FIG. 5 is drawing, schematically illustrating a consequent chip after performing the procedure the flow diagram as shown in FIG. 4.

Thus, also together referring the FIG. 5, it is a drawing, schematically illustrating a consequent chip after performing the procedure the flow diagram as shown in FIG. 4. The chip 500 includes a number X of output bonding pads, a number Y of dummy loads, a number of buffering devices, and a signal source root R. As shown in FIG. 5, the quantity of X is equal to 6, the quantity of Y is equal to 2, and the summation of X and Y is equal to $2^M$, where M is set to be equal to 3 as an example. Each one of the output bonding pads and each one of the dummy loads is respectively treated as one node. A number X of output bonding pads include the output bonding pads 510, 520, 530, 540, 550, 560, and 570. A number Y of dummy loads include the dummy loads 570 and 580. The multiple buffering devices include buffering devices for the first layer, buffering devices for the second layer, . . . , and a buffering device for the $M^{th}$ layer. One buffering device for the first layer is disposed between every two nodes at about the middle place. Each one of the nodes is electrically connected to the corresponding buffering device for the first layer. For example, the buffering device for the first layer 515 is disposed between the output bonding pads 510 and 512 at the middle place, and is electrically connected to the output bonding pads 510 and 512. Also and, the buffering device for the first layer 575 is disposed between the dummy loads 570 and 580 at the middle place, and is electrically connected to the dummy loads 570 and 580. In addition, a parameter j is set to be 1<j<M+1, in which the quantity of j is a positive integer. One buffering device for the j layer is disposed between every two buffering devices for the j−1 layer at about the middle place. Each buffering devices for j−1 layer is electrically connected to the correspond buffering device for the j layer. For example, the buffering device for the second layer 525 is disposed between the two buffering devices for the first layer 515 and 535 at about the middle place, and is electrically connected to the two buffering devices for the first layer 515 and 535. A signal (not shown in drawing) exported from the signal source root R is transmitted to the number X of output bonding pads through these buffering devices for 1~M layers. For example, the signal exported from the signal source root R can be transmitted to the output bonding pad 550 through the buffering device for the third layer 545, the buffering device for the second layer 565, and the buffering device for the first layer 555. Wherein, each buffering devices for the first layer is electrically connected to the two nodes through the connection path. Each buffering devices for the j−1 layer also goes through the connection path to electrically connect to the buffering device for the j layer. As a result, all of the buffering devices are located in the same one straight line.

In summary, the preferred embodiment of the present invention as in the foregoing descriptions has disclosed an implementing method for the buffering devices, so that the signal, which is required to have the feature of synchronous need, can arrive at the output bonding pads at the same time. This further prevents the part of unnecessary job of adjustment and test from being repeatedly performed during designing the integrated circuit, so that the needed time used in designing the integrated circuit can be effectively reduced, and the researching and developing cost is further reduced. The effectiveness and competition of the product can be effectively improved.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A chip, comprising:
   a number $2^M$ of output bonding pads, where a power index M is a number of layers greater than 1;
   a plurality of buffering devices, including a buffering device for an $i^{th}$ layer, where a parameter i=1 to M and i is a positive integer, wherein one of the buffering devices for the $1^{st}$ layer is disposed at about a middle place between every two of the output bonding pads, each one of the output bonding pads is electrically connected to the corresponding one of the buffering devices for the $1^{st}$ layer, one of the buffering devices for the jth layer is disposed at about a middle place between every two of the buffering devices for the j−1th layer, each one of the buffering devices for the j−1th layer is electrically connected to the corresponding one of the buffering devices for the jth layer, wherein 1<j<M+1, and the quantity of j is a positive integer; and
   a signal source root, used to export a signal, the signal being transmitted to the number $2^M$ of output bonding pads, going through the buffering devices.

2. The chip as recited in claim 1, wherein each one of the output bonding pads is electrically connected to the corresponding one of the buffering devices for the $1^{st}$ layer through a connection path.

3. The chip as recited in claim 1, wherein each one of the buffering devices for the j–th layer is electrically connected to the corresponding one of the buffering devices for the jth layer through a connection path.

4. The chip as recited in claim 1, wherein the buffering devices are located at the same straight line.

5. A chip, comprising:
a number X of output bonding pads and a number Y of dummy loads, each one of the output bonding pads and each one of the dummy loads being treated as a node, wherein the summation of the number X and the number Y is equal to a quantity of $2^M$, where a power index M is a number of layers greater than 1;
a plurality of buffering devices, including a buffering device for an $i^{th}$ layer, where a parameter i=1 to M and i is a positive integer, wherein one of the buffering devices for the $1^{st}$ layer is disposed at about a middle place between every two of the nodes, each one of the nodes is electrically connected to the corresponding one of the buffering devices for the $1^{st}$ layer, one of the buffering devices for the jth layer is disposed at about a middle place between every two of the buffering devices for the j–1th layer, each one of the buffering devices for the j–1th layer is electrically connected to the corresponding one of the buffering devices for the jth layer, wherein 1<j<M+1, and the quantity of j is a positive integer; and
a signal source root, used to export a signal, the signal being transmitted to the number X of output bonding pads, going through the buffering devices.

6. The chip as recited in claim 5, wherein each one of the output bonding pads is electrically connected to the corresponding one of the buffering devices for the $1^{st}$ layer through a connection path.

7. The chip as recited in claim 5, wherein each one of the buffering devices for the j–1th layer is electrically connected to the corresponding one of the buffering devices for the jth layer through a connection path.

8. The chip as recited in claim 5, wherein the buffering devices are located at the same straight line.

* * * * *